(12) United States Patent
Kim et al.

(10) Patent No.: US 7,220,652 B2
(45) Date of Patent: May 22, 2007

(54) METAL-INSULATOR-METAL CAPACITOR AND INTERCONNECTING STRUCTURE

(75) Inventors: Yoon-hae Kim, Gyeonggi-do (KR); Kyung-tae Lee, Seoul (KR); Seong-ho Liu, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 240 days.

(21) Appl. No.: 10/901,239

(22) Filed: Jul. 29, 2004

(65) Prior Publication Data
US 2005/0024979 A1    Feb. 3, 2005

(30) Foreign Application Priority Data
Jul. 29, 2003   (KR)   .................... 10-2003-0052398

(51) Int. Cl.
*H01L 21/20* (2006.01)

(52) U.S. Cl. ................. 438/386; 257/E21.396

(58) Field of Classification Search ................ 438/244, 438/253, 254, 396, 243, 387, 386, 238; 257/E21.396
See application file for complete search history.

(56) References Cited

U.S. PATENT DOCUMENTS

2003/0098484 A1*  5/2003  Kim ........................... 257/307
2004/0175883 A1*  9/2004  Kim ........................... 438/244

FOREIGN PATENT DOCUMENTS

| KR | 000053453 A | 8/2000 |
| KR | 1020000053453 A | 8/2000 |
| KR | 1020020094598 | 12/2002 |

* cited by examiner

*Primary Examiner*—Asok Kumar Sarkar
(74) *Attorney, Agent, or Firm*—Volentine & Whitt, PLLC

(57) ABSTRACT

A method of manufacturing a MIM capacitor and a interconnecting structure using a damascene process. The MIM capacitor and the first interconnecting structure can be formed at equal depths.

24 Claims, 17 Drawing Sheets

METAL-INSULATOR-METAL CAPACITOR AND INTERCONNECTING STRUCTURE

BACKGROUND OF THE INVENTION

1. Field of the Invention

Embodiments of the present invention relate to manufacturing a semiconductor device including a capacitor (e.g. MIM capacitor) and interconnecting structure using a damascene process.

This application claims the priority of Korean Patent Application No. 2003-52398 filed on Jul. 29, 2003, in the Korean Intellectual Property Office, the disclosure of which is incorporated herein in its entirety by reference.

2. Description of the Related Art

As the integration density of semiconductor devices increases in certain applications, increased capacitance of capacitors is required to ensure safe operation of the capacitors. However, a metal-insulator-semiconductor (MIS) capacitor may have the drawback of low capacitance due to a low dielectric constant film between a polysilicon film and a dielectric film. Therefore, a metal-insulator-metal (MIM) capacitor may be used for safer operation.

A MIM capacitor may be connected to peripheral metal interconnecting layers or a drain region of a transistor via contact plugs. An interconnecting structure with interconnected metal interconnecting layers may be formed around the MIM capacitor. The interconnecting structure may be a structure interconnected between an upper metal interconnecting layer and a lower metal interconnecting layer by a contact plug (e.g. a tungsten plug).

Copper may be advantageous as a metal interconnecting material for increasing speed of semiconductor devices. Copper interconnecting can increase reliability of a semiconductor device, since it has a lower electric resistance than aluminum wire and has favorable electromigration characteristics. However, copper interconnecting patterns are generally not formed by an etching process. Rather, copper interconnecting patterns may be formed by a damascene process, because copper can be a difficult material to etch.

In forming an interconnecting structure and an MIM capacitor using a damascene process, difficulty may be encountered in manufacturing vias due to the different depths of vias in the interconnecting structure and the MIM capacitor. For example, a via contacting a lower electrode of the MIM capacitor may be formed prior to forming a via contacting an upper electrode of the MIM capacitor. Accordingly, the metal electrode under the via may be damaged due to different etching depths.

Example FIGS. 1A and 1B are cross-sectional views of a MIM capacitor and an interconnecting structure. In example FIGS. 1A and 1B, lower metal interconnecting layers 11 and 21 act as a lower electrode of the MIM capacitors 10 and 20. The MIM capacitors 10 and 20 include lower metal interconnecting layers 11 and 21, capacitor dielectric films 12 and 22, and upper electrodes 13 and 23. The upper electrodes 13 and 23 of the MIM capacitors 10 and 20 are connected to upper metal interconnecting layers 17 and 27 by contact plugs 15a, 16a and 25a. The lower metal interconnecting layers 11 and 21 act as lower electrodes of the MIM capacitors 10 and 20. The lower metal interconnecting layers 11 and 21 are connected to the upper metal interconnecting layers 18 and 28 by contact plugs 19a and 29a. The contact plugs 15a, 16a, 19a, 25a and 29a are formed by filling the vias 15b, 16b, 19b, 25b and 29b, formed in inter-metal insulating layers 14 and 24, with metal material.

In example FIG. 1A, the upper electrode 13 may be damaged when etching the inter-metal insulating layer 14 to form the via 19b, because the vias 15b and 16b are formed prior to via 19a. The via 19b is formed prior to vias 15b and 16b because the via 19b is deeper than the vias 15b and 16b. For example, when the upper electrode 13 and the lower electrode 11 opened by vias 15b and 16b, a short circuit connection between the upper electrode 13 and the lower electrode 11 may be formed by the contact plugs 15a and 16a. If the upper electrode 13 and the lower electrode 11 are interconnected, the MIM capacitor may not function properly.

The device illustrated in example FIG. 1B has an analogous structure to the device shown in example FIG. 1A. However, a contact plug 25a, connected to an upper electrode 23, is separated from a lower electrode 21. By separating the contact plug 25a from the lower electrode 21, a short circuit connection between the upper electrode 23 and the lower electrode 21, made by the material forming the contact plug, can be avoided even if the via connecting an upper interconnecting layer to the upper electrode 23 is formed through the upper electrode 23 and the capacitor dielectric film 22. Nevertheless, etching damage to the upper electrode 23 through a via 25b can not be completely avoided when etching the via 29b, because the via 29b is deeper than the via 25b.

Example FIGS. 2A and 2B are cross-sectional views of a device including a MIM capacitor and an interconnecting structure. In the device illustrated in example FIGS. 2A and 2B, in addition to lower metal interconnecting layers 39c and 49c, lower electrodes 31 and 41 of the MIM capacitor are formed. The lower electrodes 31 and 41 are connected to upper metal interconnecting layers 38 and 48 by contact plugs 36a and 46a, respectively.

Referring to example FIGS. 2A and 2B, MIM capacitors 30, 40 (including lower electrodes 31 and 41, capacitor dielectric layers 32 and 42, and upper electrodes 33 and 43) are formed on an insulating layer 5. The upper electrodes 33 and 43 of the MIM capacitors 30 and 40 are connected to the upper metal interconnecting layers 37 and 47 by contact plugs 35a and 45a. The lower metal interconnecting layers 39c and 49c, formed separately from the lower electrodes 31 and 41, are connected to the upper metal interconnecting layers 38 and 48 by the contact plugs 39a and 49a.

In the device illustrated in example FIG. 2A, a via 39b (for connecting the lower metal interconnecting layer 39c to the upper metal interconnecting layer 38) is deeper than vias 35b and 36b (for connecting the upper electrode 33 and the lower electrode 31 to the upper metal interconnecting layers 37 and 38, respectively). Accordingly, the upper electrode 33 and the lower electrode 31 may be damaged when etching the via 39b since the vias 35b and 36b are formed prior to the via 39b.

The device illustrated in example FIG. 2B has an analogous structure to the device shown in example FIG. 2A. However, a contact plug 45a (for connecting an upper electrode 43 of an MIM capacitor 40) is separated from a lower electrode 41. By separating the contact plug 45a from an end part of the lower electrode 41, a connection between the upper electrode 43 and the lower electrode 41 by the contact plug material can be avoided, even if the via 45b for connecting an upper metal interconnecting 47 to the upper electrode 43 is formed through the upper electrode 43. However, etching damage to the upper electrode 43 and the lower electrode 41 through the vias 45b and 46b can not be completely avoided when etching the via 49b, because the via 49b is deeper than the vias 45b and 26b.

In order to solve this problem, research has gone into finding methods of forming a trench in the MIM capacitor in the inter-metal insulating layer so that vias for connecting the MIM capacitor to a metal interconnecting layer can have equal depths. For example, Korea Laid-Open Patent publication 2000-53453 discloses a method of forming a MIM capacitor in a trench having the same depth as an opening for a interconnecting structure using a double damascene method. When the interconnecting structure and the trench for the MIM capacitor are formed to the same depth, a via for connecting the MIM capacitor and a via for connecting the interconnecting structure to respective upper metal interconnecting layer can be formed at equal depths. Also, a capacitance of a semiconductor device can be increased by forming the MIM capacitor in a trench.

However, in this method (of Korean Laid-Open Patent publication 2000-53453), since a portion (for forming the trench of the MIM capacitor) is masked while depositing metal to form a interconnecting structure using a photoresist mask, a selective metal deposition is practically impossible. Electroplating for forming a copper interconnecting structure is generally carried out in a sulfuric acid ($H_2SO_4$) based solution. However, photoresist material may be degraded by the sulfuric acid solution. Therefore, the photoresist material for masking the trench portion cannot perform an adequate masking role. The process may be necessarily complicated, because electroplating the interconnecting structure and electroplating the MIM capacitor must be performed separately. Planarization of a copper layer after electroplating may also be difficult, due to the large step.

SUMMARY OF THE INVENTION

Embodiments of the present invention relate to a method of manufacturing a semiconductor device in which a via connecting an interconnecting structure and a via connecting a MIM capacitor are formed at equal depths. Accordingly, in embodiments, the capacitance of the MIM capacitor may be increased and the reliability of the interconnecting structure and the MIM capacitor may be enhanced.

According to embodiments of the present invention, a method of manufacturing a semiconductor device comprises the following steps: Forming a lower inter-metal insulating film on a lower metal interconnecting layer. Forming a trench for a MIM capacitor in the lower inter-metal insulating film, exposing the lower metal interconnecting layer. Forming a first conductive film on an upper barrier layer after sequentially depositing a lower barrier metal layer, a capacitor dielectric film, and the upper barrier metal layer on an entire surface (including a surface of the trench for the MIM capacitor). Forming a MIM capacitor in the trench by planarizing the first conductive film. Forming a via for metal interconnecting and a trench for metal interconnecting in the lower inter-metal insulating film, exposing the lower metal interconnecting layer. Forming a second conductive film, filling the via for metal interconnecting and the trench for metal interconnecting. Forming a first interconnecting structure having a depth equal to that of the MIM capacitor, by planarizing the second conductive film.

In embodiments, the method further comprises the following steps, after for forming the first interconnecting structure: Forming an upper inter-metal insulating film on the MIM capacitor and the first interconnecting structure. Forming a via for connecting to the MIM capacitor in the upper inter-metal insulating film and a via connecting to the first interconnecting structure to equal depths. In embodiments, the method further comprises forming the second conductive film, forming a metal barrier layer on the via for metal interconnecting and the trench for metal interconnecting.

A method of manufacturing a semiconductor device according to embodiments of the present invention, wherein the forming the lower inter-metal insulating film on the lower metal interconnecting layer comprises the following steps: Forming a first etch stopper on the lower metal interconnecting layer. Forming a first inter-metal insulating film on the first etch stopper. Forming a second etch stopper on the first inter-metal insulating film. Forming a second inter-metal insulating film on the second etch stopper. Forming a buffer insulating film on the second inter-metal insulating film. The etch stopper may be formed of a material selected from the group consisting of SiC, SiN, SiCN, and SiCO. The buffer insulating film may be formed of a material selected from the group consisting of Fluorine-doped Silicate Glass (FSG) and Undoped Silicate Glass (USG).

The method also further comprises, in embodiments, prior to forming the via for metal interconnecting or forming the trench for metal interconnecting, forming an etch stopper on an entire surface (including a surface of the planarized first conductive film).

The trench pattern for forming the MIM capacitor may be formed in a mesh pattern on the layout of a mask. The trench for the metal interconnecting in the lower inter-metal insulating film may be formed after the via in the lower inter-metal insulating film is formed. The via for the metal interconnecting in the lower inter-metal insulating film can be formed after the trench for metal interconnecting in the lower inter-metal insulating film is formed. The capacitor dielectric film may be formed along a surface of the trench for forming the MIM capacitor using one of ALD and CVD. The capacitor dielectric film may be formed of a film selected form a group consisting of a $SiO_2$ film, a $Si_3N_4$ film, a $Ta_2O_5$ film, a $TiO_2$ film, and an $Al_2O_3$ film.

In embodiments, the lower metal interconnecting layer, the first conductive film, and the second conductive film are formed of copper. However, the lower metal interconnecting layer, the first conductive film, and the second conductive film may comprise a material selected from a group consisting of Al, Au, Ag, Ti, Ta, W and an alloy of these metals. The barrier metal layers may be formed of a layer selected from a group of consisting of a Ta layer, a TaN layer, a WN layer, and a layer with a Ta layer/TaN layer structure. In embodiments, the barrier layers block the diffusion of the conductive film into the inter-metal insulating film.

A method of manufacturing a semiconductor device according to embodiments of the present invention, comprises the following: Forming a lower inter-metal insulating film on a lower metal interconnecting layer. Forming a trench for a MIM capacitor and a via for metal interconnecting in the lower inter-metal insulating film, exposing the lower metal interconnecting layer. Filling the trench for the MIM capacitor and the via for metal interconnecting with an insulating material. Selectively removing the insulating material from the trench for the MIM capacitor. Forming a lower metal barrier layer and a capacitor dielectric film on the entire surface including the trench for MIM capacitor. Forming a trench for metal interconnecting, connected to the via for metal interconnecting, in a portion where the via for metal interconnecting is formed. Removing the insulating material remaining in the via for metal interconnecting. Forming an upper metal barrier layer on the entire surface including the capacitor dielectric film, in the via for metal interconnecting, and in the trench for metal interconnecting.

Forming a conductive film on the upper metal barrier layer, filling the via for metal interconnecting, the trench for metal interconnecting, and the trench for the MIM capacitor. Forming the MIM capacitor and the first interconnecting structure with equal depths by planarizing the conductive film.

In embodiments, a method comprises the following steps, after the forming the MIM capacitor and the first interconnecting structure: Forming an upper inter-metal insulating film on the MIM capacitor and the first interconnecting structure. Forming a via for connecting to the MIM capacitor and a via for connecting to the first interconnecting structure in the upper inter-metal insulating film at equal depths.

In embodiments of the present invention, forming the lower inter-metal insulating film comprises the following steps: Forming a first etch stopper on the lower metal interconnecting layer. Forming a first inter-metal insulating film on the first etch stopper. Forming a second etch stopper on the first inter-metal insulating film. Forming a second inter-metal insulating film on the second etch stopper. Forming a buffer insulating film on the second inter-metal insulating film.

The etch stopper may be formed of a material selected from the group consisting of SiC, SiN, SiCN, and SiCO. The buffer insulating film may be formed of a material selected from the group consisting of FSG and USG. The trench pattern for forming the MIM capacitor may be formed in a mesh pattern on the layout of the mask. The insulating material that fills the trench for the MIM capacitor and the via for the metal interconnecting may be SOG. The capacitor dielectric film may be formed along a surface of the trench for forming the MIM capacitor using one of ALD and CVD. The capacitor dielectric film may be formed of a film selected form a group consisting of a $SiO_2$ film, a $Si_3N_4$ film, a $Ta_2O_5$ film, a $TiO_2$ film, and an $Al_2O_3$ film.

In embodiments, the lower metal interconnecting layer and the conductive film are formed of copper. However, in other embodiments, the lower metal interconnecting layer and the conductive film can be formed of a material selected from a group consisting of Al, Au, Ag, Ti, Ta, W and an alloy of these metals. In embodiments, the barrier metal layers are formed of a layer selected from a group of consisting of a Ta layer, a TaN layer, a WN layer, and a layer with a Ta layer/TaN layer structure. The barrier layers may block the diffusion of the conductive film into the inter-metal insulating film.

BRIEF DESCRIPTION OF THE DRAWINGS

Example

Example

Example

Example

DETAILED DESCRIPTION OF THE INVENTION

Hereinafter, the present invention will be described more fully with reference to the accompanying drawings in which example embodiments of the present invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art.

Figure 1A:
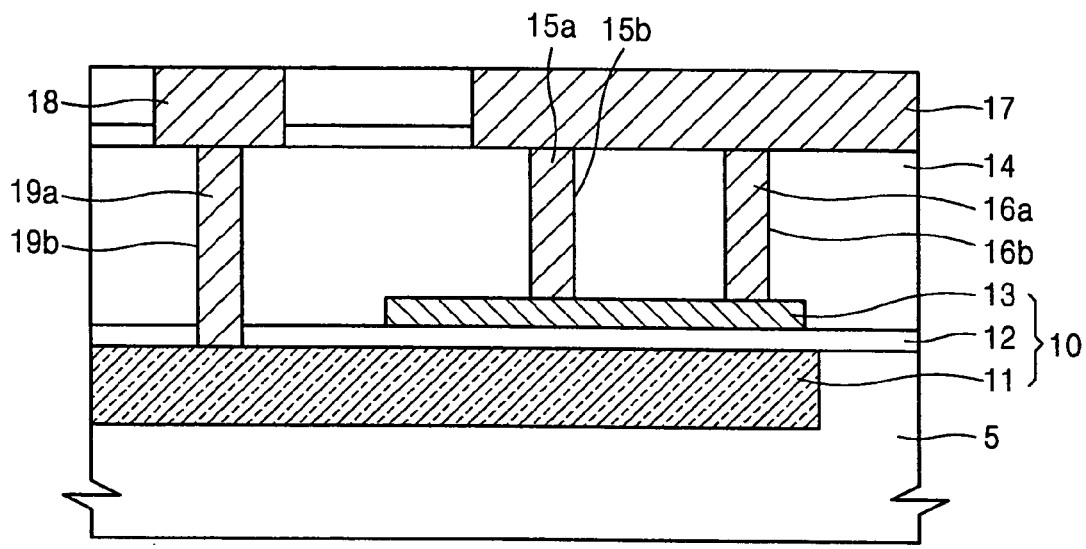
FIGS. 1A and 1B are cross-sectional views of a device including a MIM capacitor and an interconnecting structure.
Figure 1B:
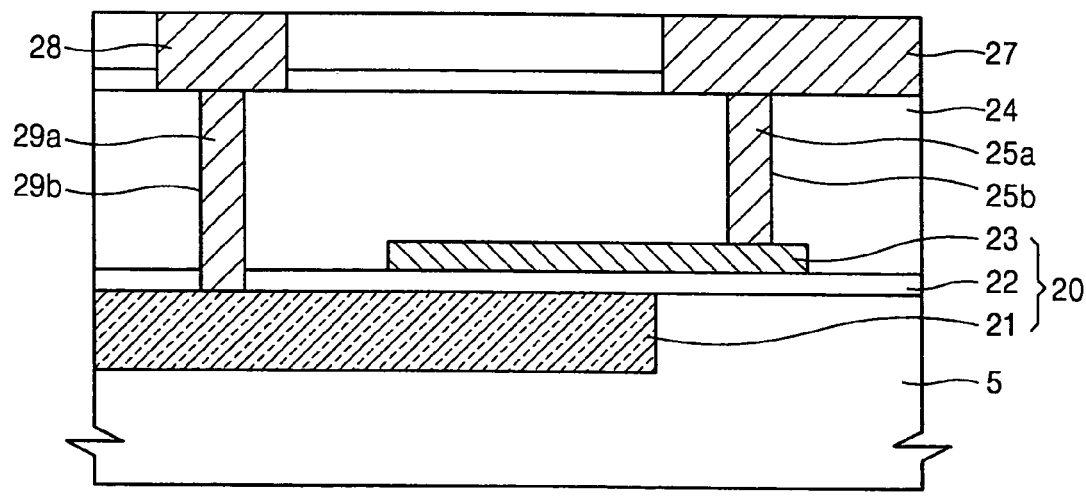
Figure 2A:
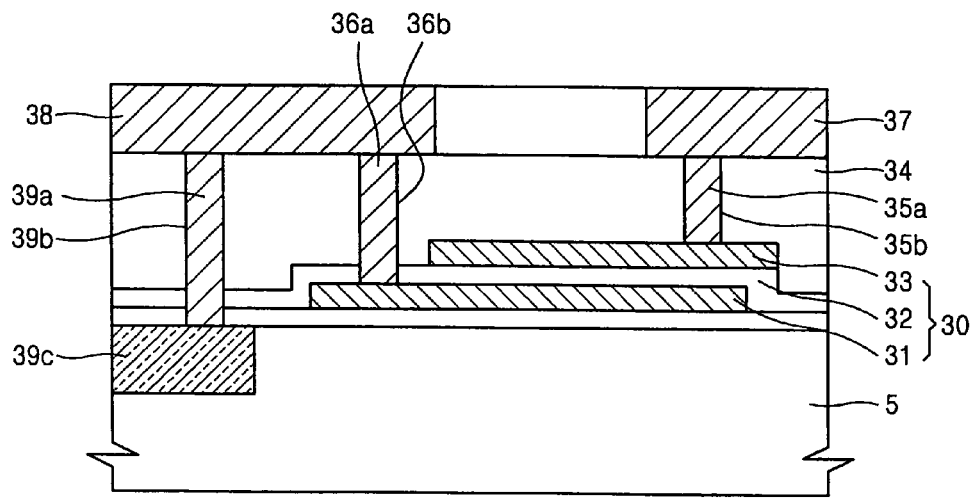
FIGS. 2A and 2B are cross-sectional views of a device including a MIM capacitor and an interconnecting structure.
Figure 2B:
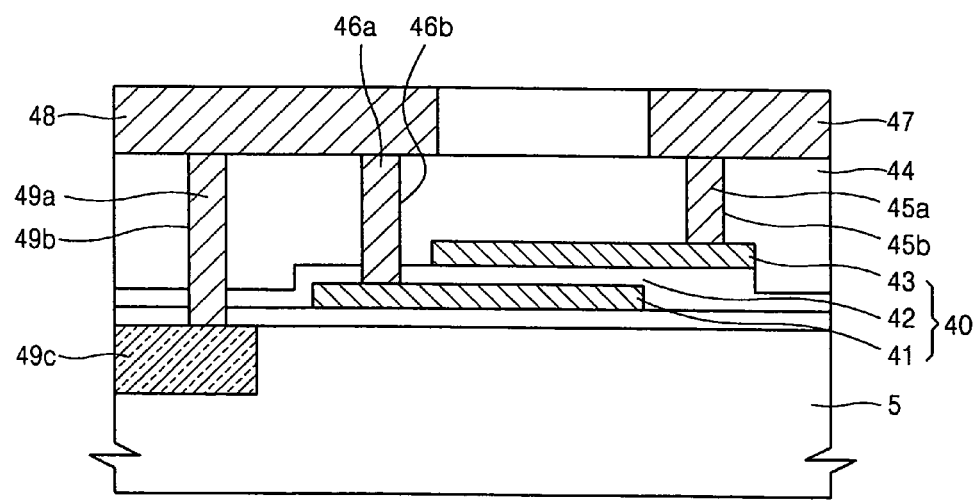
Figure 3:
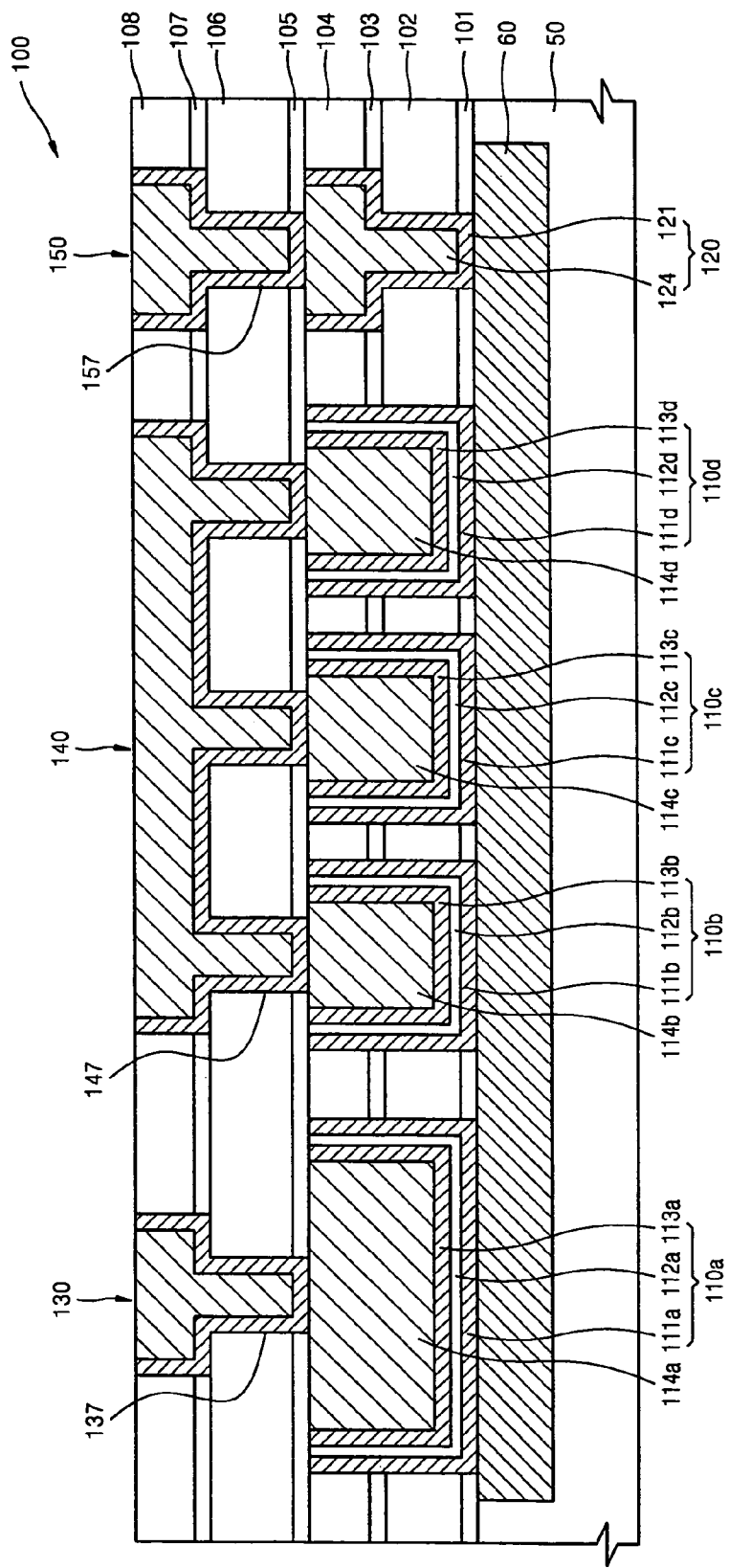
FIG. 3 is a cross-sectional view of a device including a MIM capacitor and an interconnecting structure.

Example FIG. 3 is a cross-sectional view of a device (e.g. a semiconductor device) manufactured according to embodiments of the present invention. MIM capacitors 110a, 110b, 110c, and 110d and an interconnecting structure 120 are formed at the same depth on a lower metal interconnecting layer 60 in an insulating film 50. The device 100 comprises inter-metal insulating layers 102, 104, 106, and 108. The inter-metal insulating layers 102, 104, 106, and 108 are separated by etch stop layers 101, 103, 105, and 107. The MIM capacitor 110a includes a lower electrode 11a, a capacitor dielectric film 112a, and an upper electrode 113a. The lower electrode 111a may function as a barrier metal layer. The upper electrode 113a may function as a barrier metal layer and is connected to the lower metal interconnecting layer 60. The interconnecting structure 120 includes a barrier metal layer 121 and a conductive film 124. The interconnecting structure 120 may be connected to the lower metal interconnecting layer 60. The other MIM capacitors 110b, 110c, and 110d may have similar structures as the MIM capacitor 110a, but with different widths.

The MIM capacitors 110a, 110b, 110c, and 110d and the interconnecting structure 120 may be formed to substantially the same depth. Vias 137 and 147 (for connecting the MIM capacitor 110a, 110b, 110c, and 110d) and a via 157 (for connecting the interconnecting structure 120 to respective upper metal layer 130, 140, and 150) are formed to substantially equal depths. Accordingly, in embodiments, problems caused by differences in depths of vias for the interconnecting structure and the vias for MIM capacitor, (e.g. damage to an electrode) may be avoided. The interconnecting structures 130 and 140 formed on the MIM capacitors 110a, 110b, 110c, and 110d and an interconnecting structure 150 formed on the interconnecting structure 120 are formed to substantially equal depths.

A damascene method may be used when forming the MIM capacitor and the interconnecting structure on the semiconductor device 100. For example, trenches for the metal interconnecting may be formed after forming the MIM capacitors and the vias by dry etching the inter-metal insulating layers 102 and 104 and etch stoppers 101 and 103. Each of the vias and trenches may be filled with a metal barrier layer and a conductive layer. In embodiments, a dual damascene method may be used for forming the interconnecting structure 120.

Figure 4:
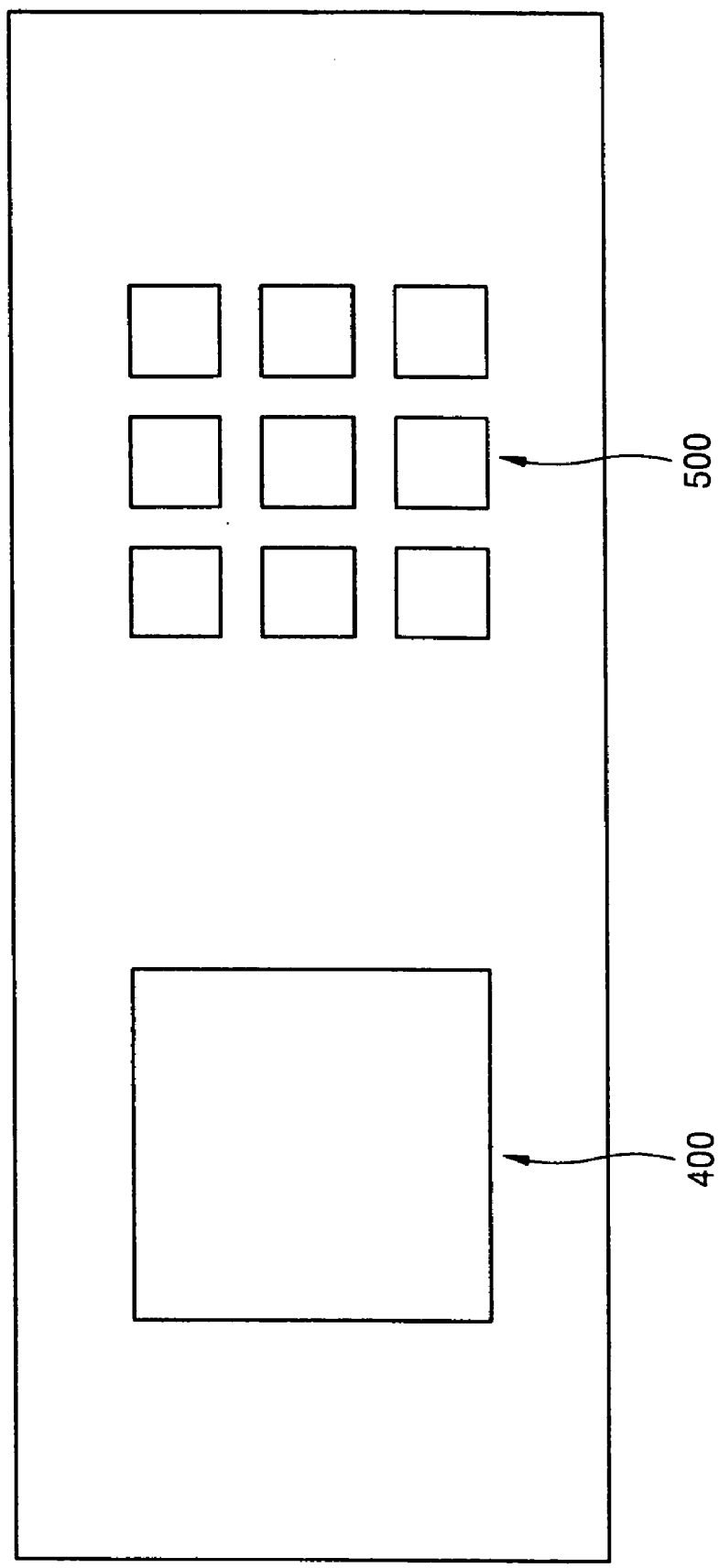
FIG. 4 is a layout of a mask used to form a MIM capacitor.

Example FIG. 4 is a layout of a mask which may be used to form the semiconductor device depicted in example FIG. 3. A relatively large mask pattern 400 (for forming a trench for the MIM capacitor) is formed and a relatively small mesh pattern mask patterns 500 (for forming trenches for a plurality of MIM capacitors) are formed in the mask. Capacitance may be maximized, in embodiments, by forming the trench pattern for the MIM capacitor with a mesh pattern, as shown in example FIG. 4.

Embodiments of the present invention relate to a method of manufacturing a semiconductor device comprising an MIM capacitor and an interconnecting structure. Copper can be used as the interconnecting material, but aluminum, gold, silver, tungsten (or an alloy of any of these metals) may also be used as the interconnecting material.

Example FIGS. 5 through 16 are cross-sectional views for describing a method of manufacturing a semiconductor device according to embodiments of the present invention. In embodiments, a trench for an MIM capacitor, vias for connections, and trenches for metal interconnecting are formed.

Figure 5:
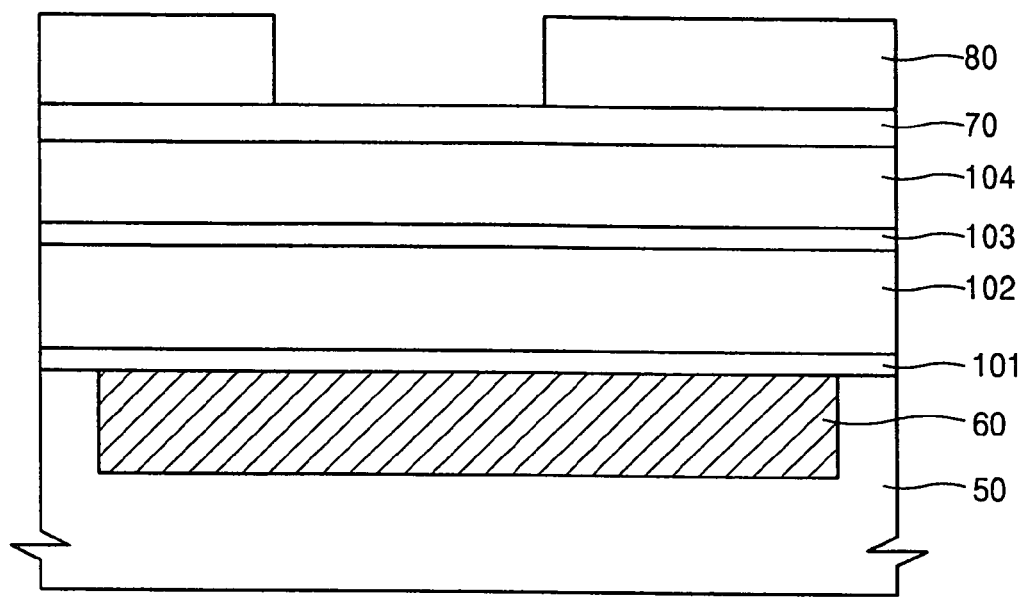
FIGS. 5 through 16 are cross-sectional views illustrating a method of manufacturing a device containing a MIM capacitor and an interconnecting structure.

Referring to example FIG. 5, a lower metal interconnecting layer 60 (e.g. formed of copper) is formed in an insulating film 50 formed on a semiconductor substrate (not shown). Inter-metal insulating layers 102 and 104 are formed over the lower metal interconnecting layer 60. Thin etching stoppers 101 and 103 made of SiC, SiN, SiCN, or SiCN are formed on the metal interconnecting layer 60 and between the inter-metal insulating films 102 and 104, respectively. A buffer insulating film 70 (e.g. formed of fluorine doped silicate glass (FSG) or undoped silicate glass (USG)) is formed on the inter-metal insulating film 104. A photo-resist layer pattern 80 is formed on the buffer insulating layer 70 to form the trench for the MIM capacitor.

Figure 6:
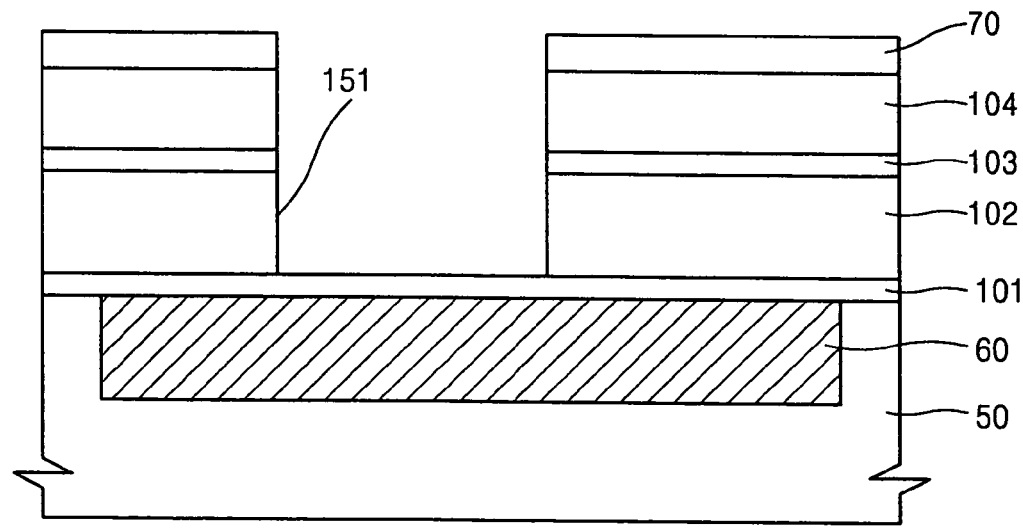
Figure 7:
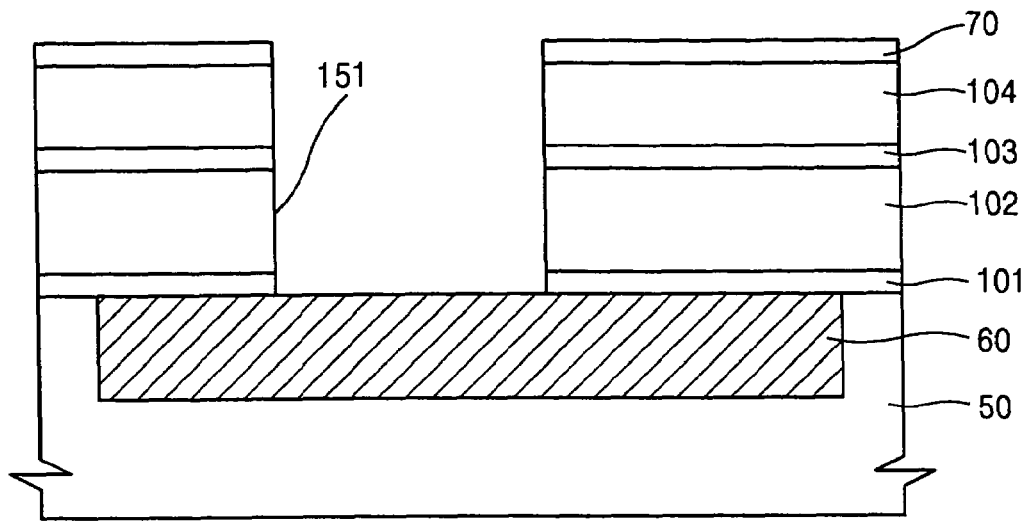

Referring to example FIG. 6, a trench 151 (for the MIM capacitor) is formed by selectively etching the buffer insulating layer 70, the inter-metal insulating films 102 and 104, and the etch stopper 103 using the photo-resist layer 80 as a mask. Referring to example FIG. 7, the lower metal interconnecting layer 60 is exposed by etching back the exposed portion to remove the etch stopper 101 remaining at the bottom of the trench 151.

Figure 8:
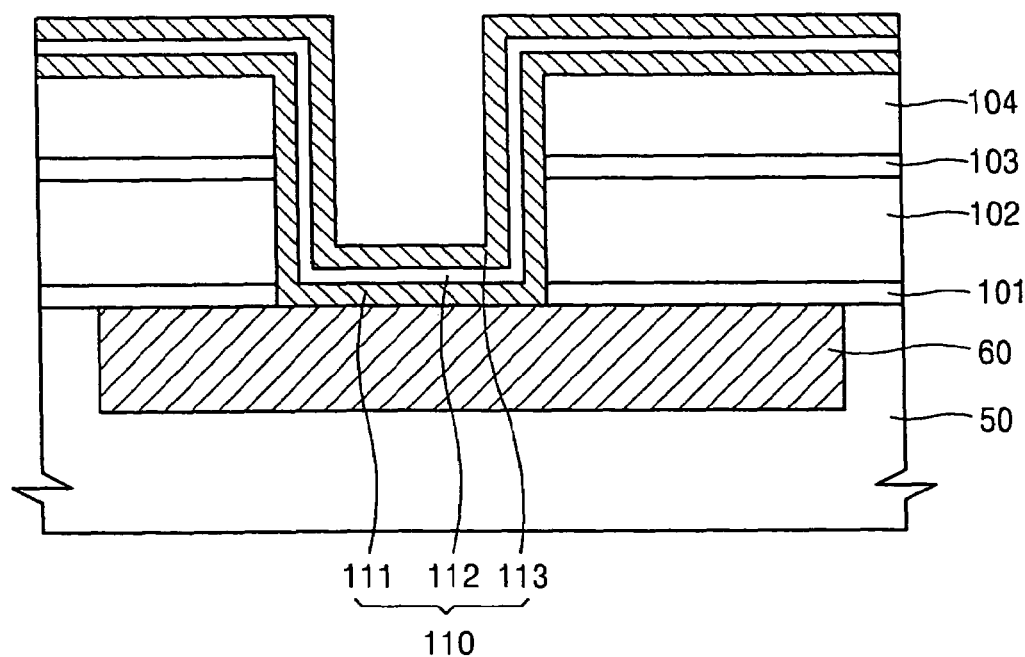

Referring to example FIG. 8, a metal barrier layer 111, a capacitor dielectric film 112, and a metal barrier layer 113 are sequentially deposited on the entire surface of the resultant structure, including the interior of the trench 151. In embodiments, the capacitor dielectric film 112 is deposited along the shape of the surface including the inner surface of the trench 151 by chemical vapor deposition (CVD) or atomic layer deposition (ALD). The metal barrier layers 111 and 113 may each be a metal layer selected from the group consisting of a Ta layer, a TaN layer, a Wn layer, and a stack of Ta layer/TaN layer. The capacitor dielectric film 112 may be formed of a $SiO_2$ film, a $Si_3N_4$ film, or a high dielectric constant film (e.g. a $Ta_2O_5$ film, a $TiO_2$ film, or an $Al_2O_3$ film). The upper metal barrier layer 113 may act as an upper electrode of the MIM capacitor. The lower metal barrier layer 111 may act as a lower electrode of the MIM capacitor.

Figure 9:
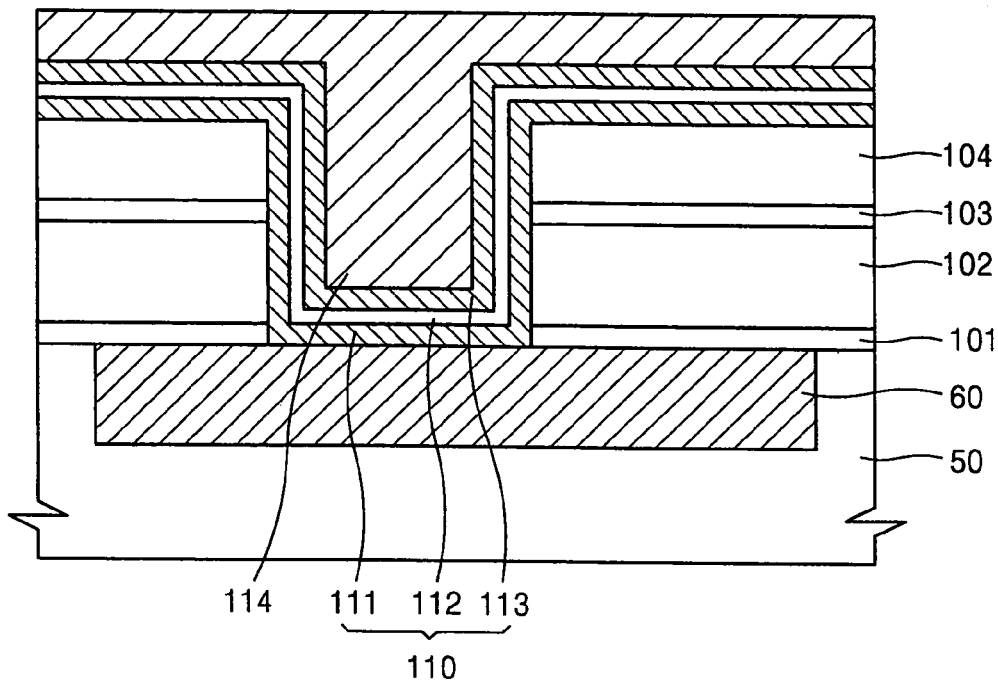

Referring to example FIG. 9, a first conductive film 114 is deposited on the metal barrier layer 113. The first conductive film 114 may be copper. However, the first conductive film 114 may alternatively be an Al film, an Au film, an Ag film, a Ti film, a Ta film, a W film, or include an alloy of any of these materials. When the first conductive film 114 is copper, a thin copper seed film may be deposited by a sputtering method and then a copper film is deposited by electroplating.

Figure 10:
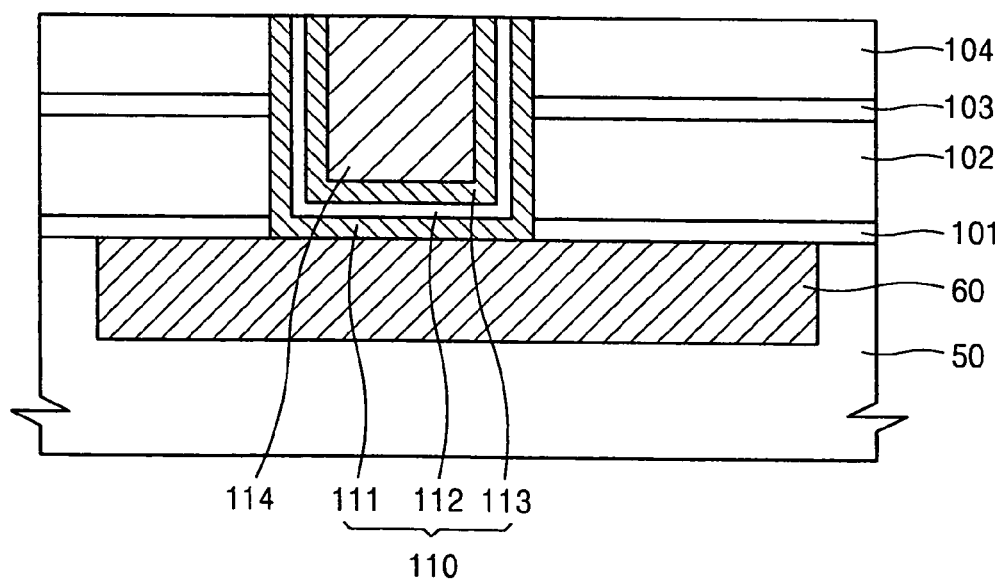

Referring to example FIG. 10, portions of the deposited first conductive film 114, the metal barrier layers 111 and 113, and the capacitor dielectric film 112 are removed by planarizing (e.g. using a chemical mechanical polishing (CMP) process). However, portions of the first conductive film 114, the metal barrier layers 111 and 113, and the capacitor dielectric film 112 that are in the trench are not removed. Accordingly, an MIM capacitor 110 including the upper electrode 113, the capacitor dielectric film 112, and the lower electrode 111 is formed in the trench 151.

Figure 11:
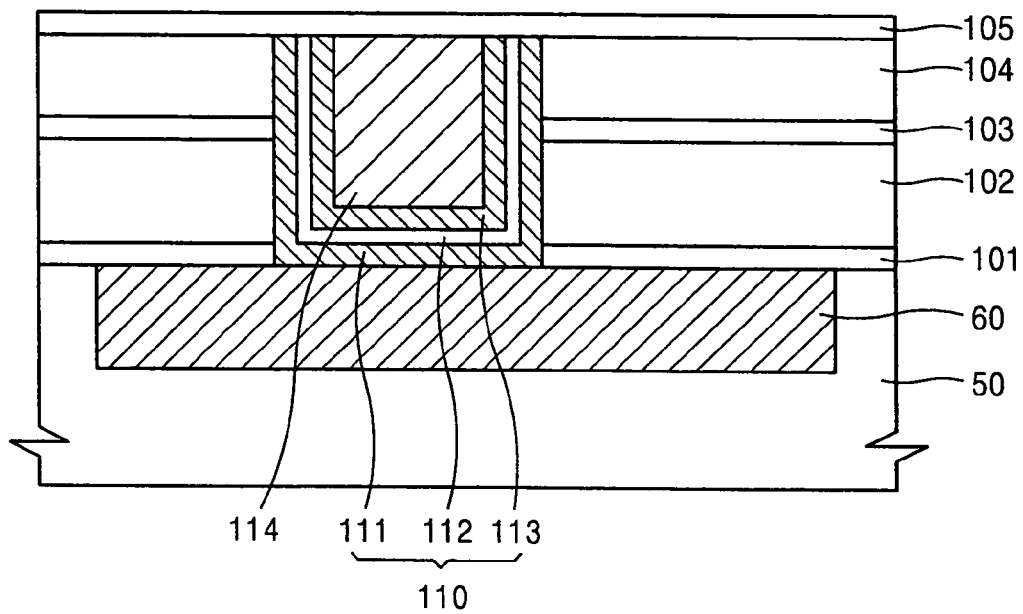
Figure 12:
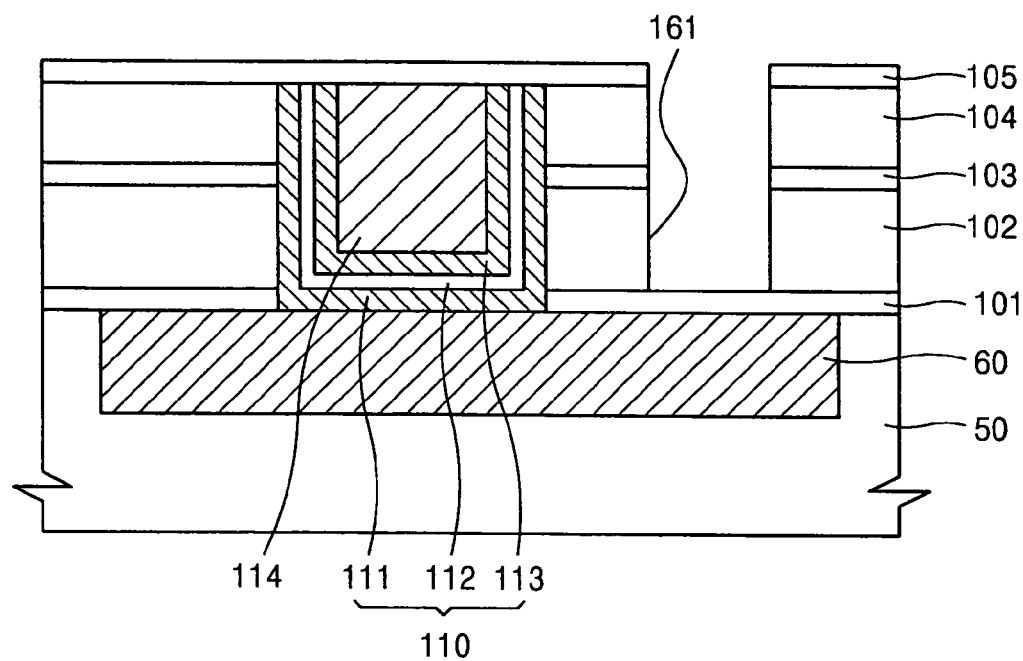
Figure 13:
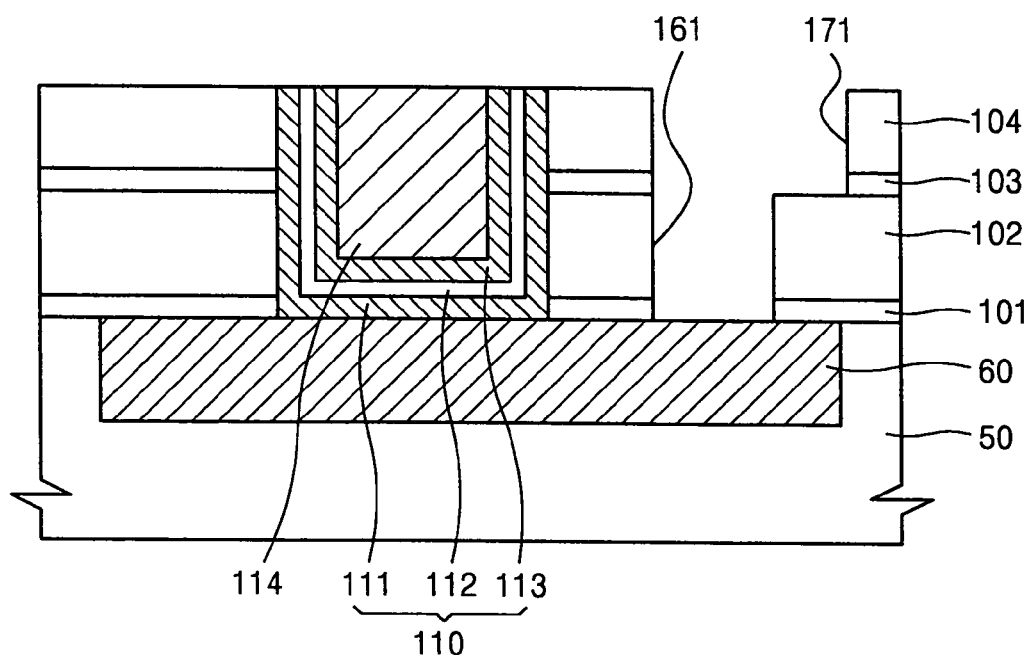
Figure 14:
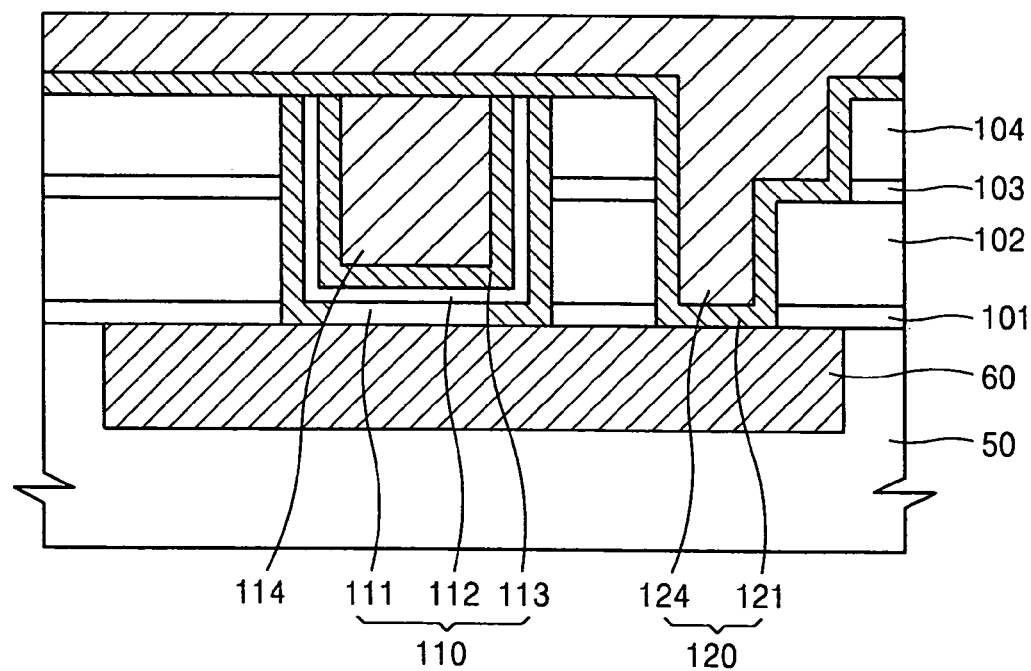

Referring to example FIG. 11, an etch stopper 105 is deposited. Referring to example FIGS. 12 and 13, a via 161 (for metal interconnecting) and a trench 171 (for metal interconnecting) are formed using a dual damascene process. Referring to example FIG. 14, a second conductive film 124 is deposited after depositing a metal barrier 121 on the entire surface of the structure of FIG. 13, including the via 161 and the trench 171. The second conductive film 124 may be formed of copper, but may also be an Al film, an Au film, an Ag film, a Ti film, a Ta film, a W film, or include an alloy of these materials. Referring to example FIG. 15, the inter-metal insulating film 104 is exposed by planarizing the second conductive film 124 and the metal barrier layer 121 using a CMP process. An interconnecting structure 120 including the metal barrier layer 121 and the second conductive film 124 is formed. The MIM capacitor 110 and the interconnecting structure 120 have equal depths after planarizing.

Figure 15:
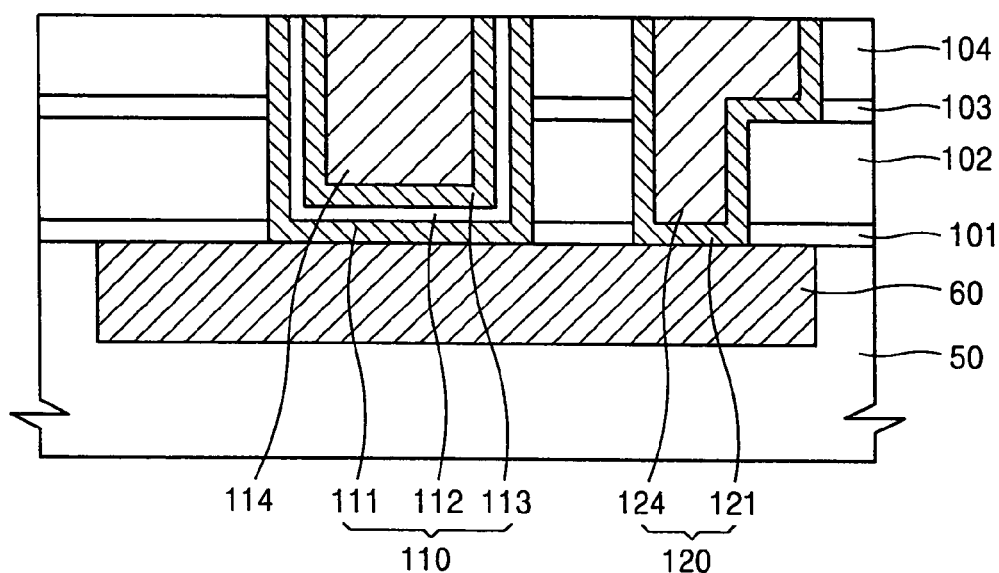
Figure 16:
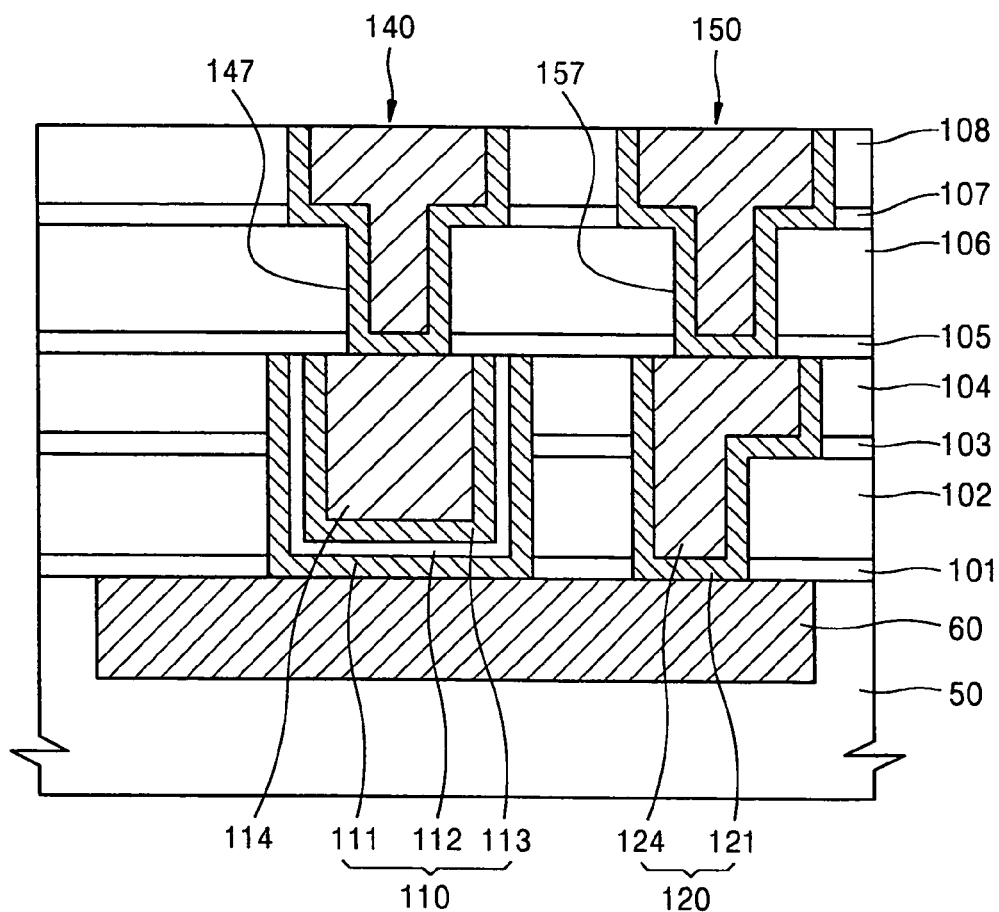

Referring to example FIG. 16, vias 147 and 157 are formed (using a dual damascene process) after forming inter-metal insulating films 106 and 108 and etch stoppers 105 and 107 on the structure illustrated in FIG. 15. Since the MIM capacitor 110 and the interconnecting structure 120 are formed at equal depths, the via 147 connecting the MIM capacitor 110 to an interconnecting structure 140 and the via 157 connecting the interconnecting structure 120 to an interconnecting structure 150 may be formed at equal depths. Accordingly, in embodiments, when forming the via 157, damage to the upper electrode 113 and the first conductive film 114 on the upper electrode 113 when forming the via 147 can be prevented. The upper interconnecting structures 140 and 150 may be formed by filling the vias 147 and 157 with the metal barrier layer and the conductive film.

In embodiments of the present invention, the via 147 (connecting the MIM capacitor 110 to the metal interconnecting layer 140) and the via 157 (connecting the interconnecting structure 120 to the metal interconnecting layer 150) can be formed to equal depths because the MIM capacitor 110 and the interconnecting structure 120 are formed at equal depths. Accordingly, the upper interconnecting structures 140 and 150 having the same depth, may be formed without damaging the upper electrode 113 of the MIM capacitor or the first conductive film 114 on the upper electrode 113. Further, in embodiments, when forming the first conductive film 114 and the second conductive film 124, a photo-resist mask may not be necessary. Accordingly, a photo-resist mask will not be damaged by a sulfuric acid solution when electroplating the conductive films 114 and 124.

Example FIGS. 17 through 29 are cross-sectional views according to embodiments of the present invention. In embodiments, a via for metal interconnecting having the same depth as a trench for an MIM capacitor is formed at the same time as the trench for the MIM capacitor.

Figure 17:
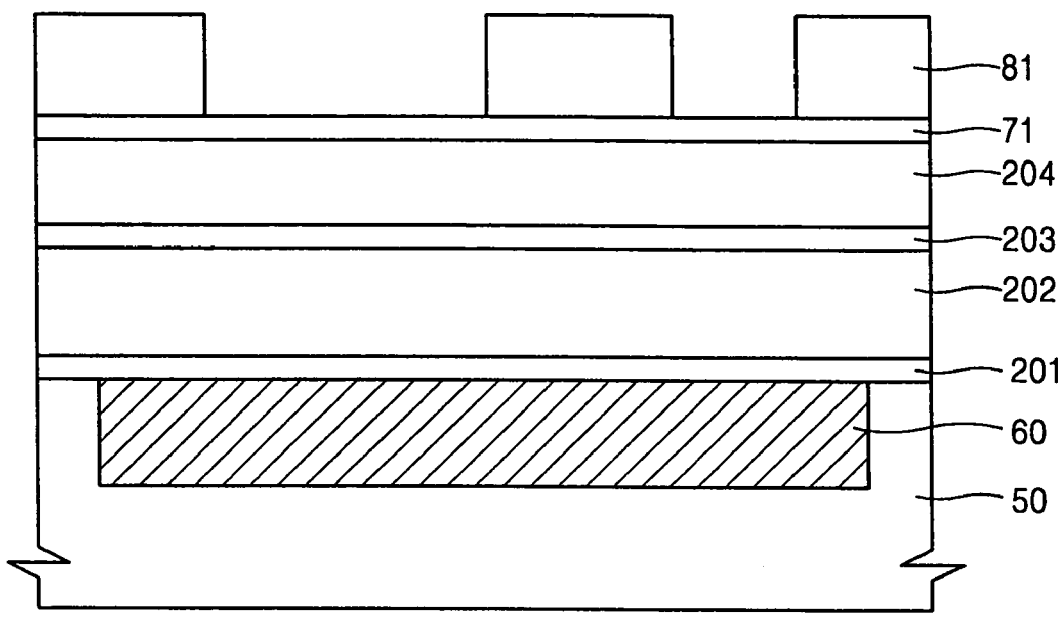
FIGS. 17 through 29 are cross-sectional views illustrating a method of manufacturing a device containing a MIM capacitor and an interconnecting structure.

Referring to example FIG. 17, a lower metal interconnecting layer 60 (e.g. formed of copper) is formed in an insulating film 50 on a semiconductor substrate (not shown). Thin etch stoppers 201 and 203 formed of SiC, SiN, SiCN, or SiCO are formed on the lower metal interconnecting layer 60 and between the inter-metal insulating films 202 and 204. A buffer insulating film 71 (e.g. formed of FSG or USG) is formed on the inter-metal insulating film 204. A photo-resist pattern 81 is formed on the buffer insulating film 71 to form a trench for the MIM capacitor and a via for a metal interconnecting.

Figure 18:
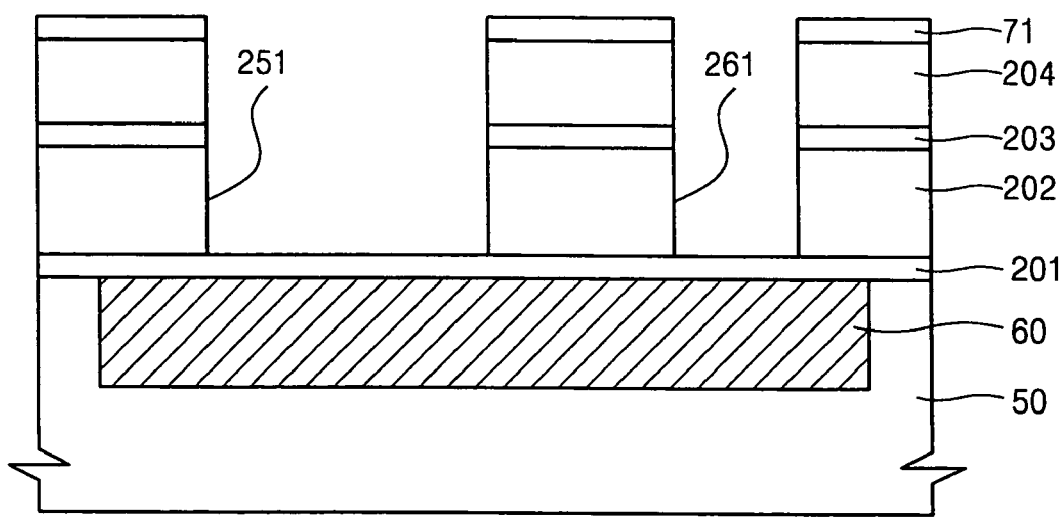
Figure 19:
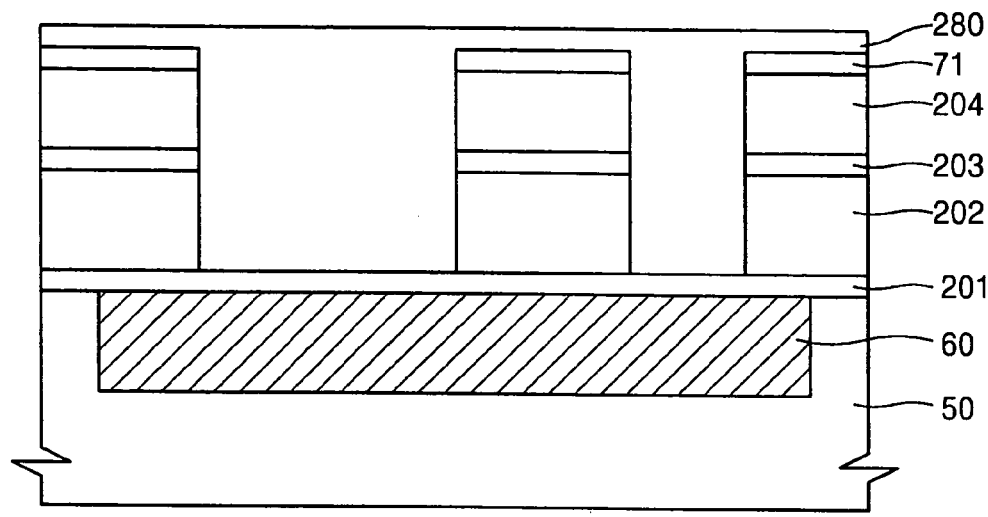
Figure 20:
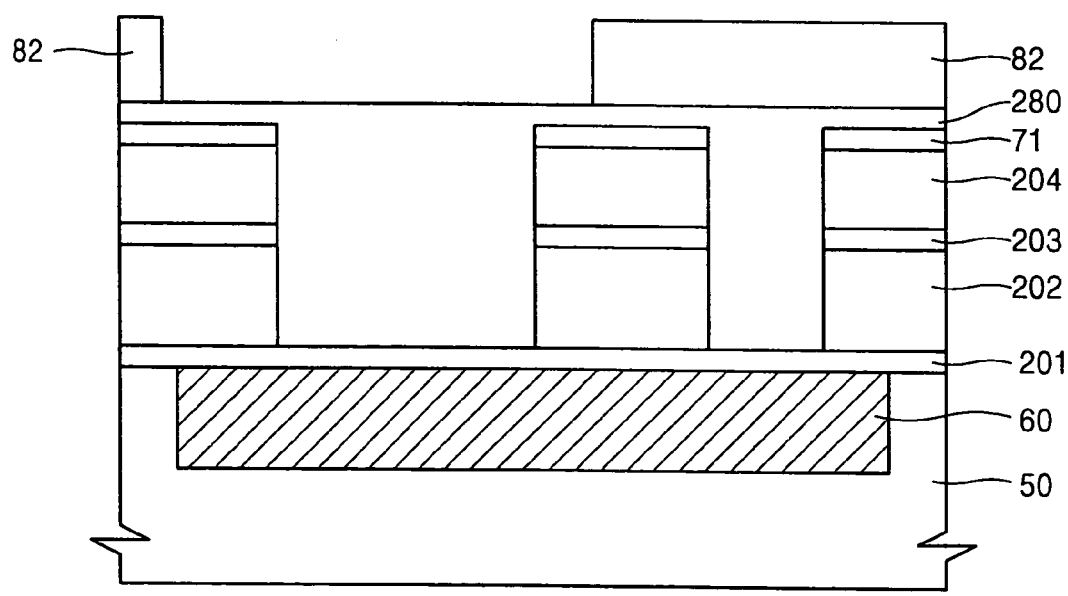

Referring to example FIG. 18, a trench 251 for the MIM capacitor and a via 261 for the metal interconnecting are formed at the same time by selectively etching the buffer insulating film 71, the inter-metal insulating films 202 and 204, and the etch stopper 203, using the photo-resist layer 81 as a mask. Referring to example FIG. 19, the trench 251 and the via 261 are filled with a spin on glass (SOG) material 280. Referring to example FIGS. 20 and 21, only the trench 251 is exposed in a photo etching process using a photo-resist layer 82 as an etch mask. The via 261 remains filled with the SOG material 280, as most of the SOG material 280 is removed from the trench 251.

Figure 21:
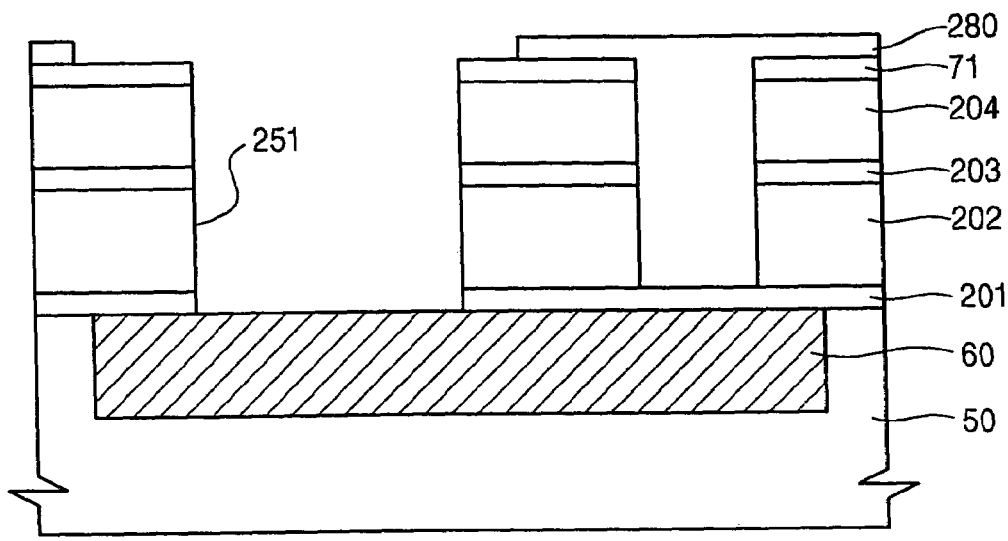
Figure 22:
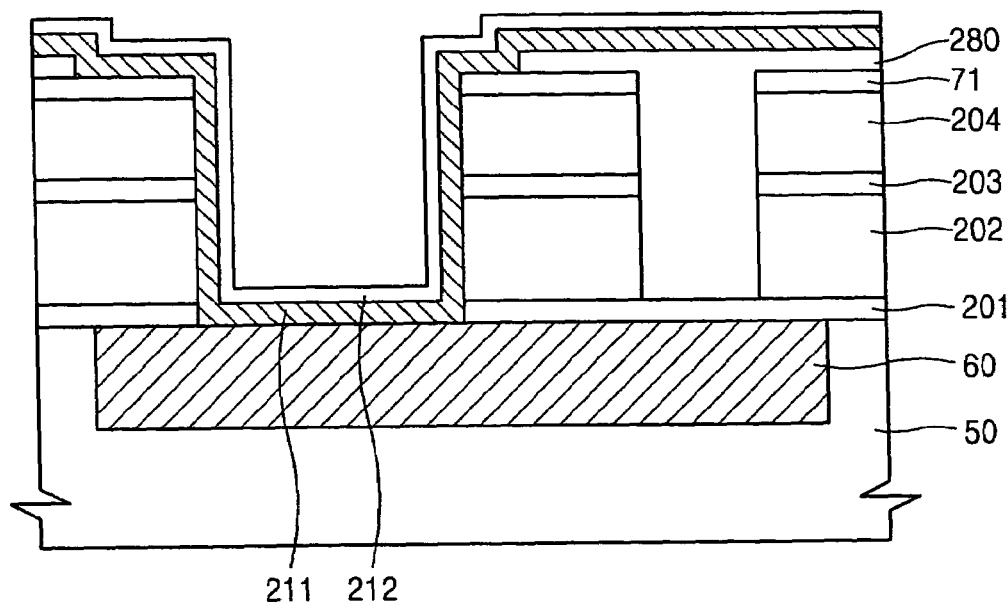

Referring to example FIG. 22, a barrier metal layer 211 and a capacitor dielectric film 212 are sequentially formed on the structure illustrated in example FIG. 21 (including the opened trench 251 and the surface of the SOG material 280). The capacitor dielectric film 212 is deposited in the interior surface of the trench (e.g. using a CVD or an ALD process). The metal barrier layer 211 may be a Ta film, a TaN film, a WN film, or layer with a Ta film/TaN film structure. The capacitor dielectric film 212 may be a $SiO_2$ film, a $Si_3N_4$ film, or a high dielectric constant film (e.g. a $Ta_2O_5$ film, a $TiO_2$ film, or an $Al_2O_3$ film). The metal barrier layer 211 may act as the lower electrode layer of the MIM capacitor.

Figure 23:
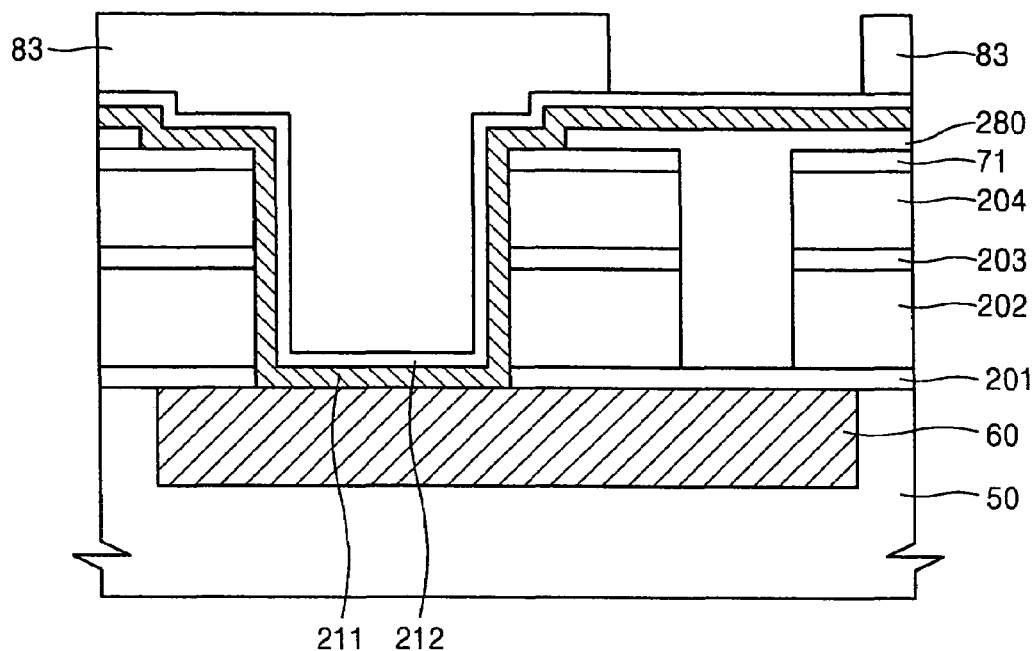
Figure 24:
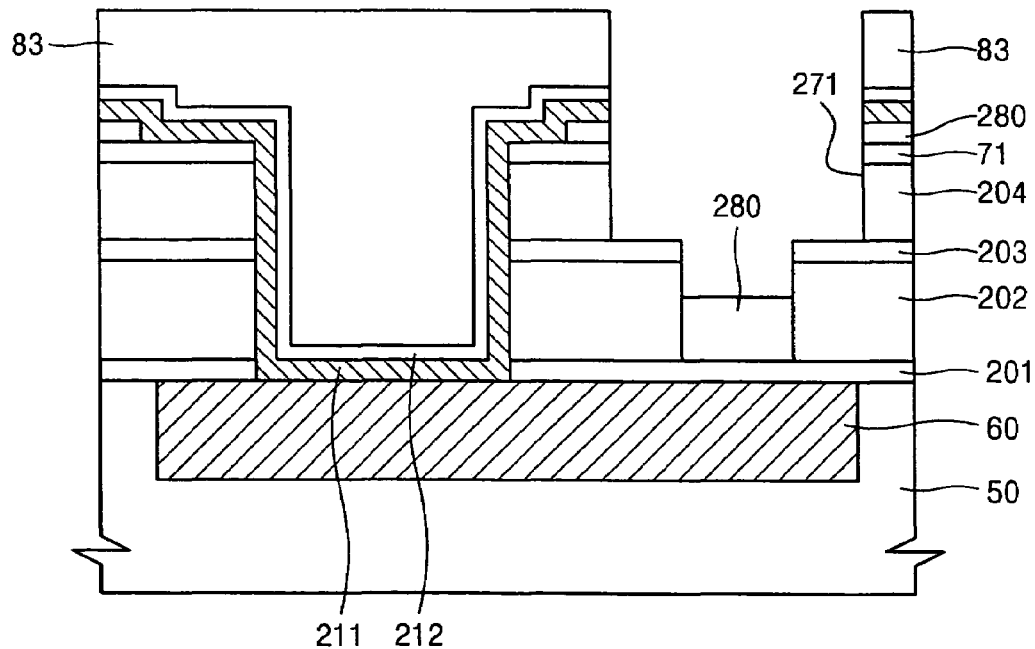
Figure 25:
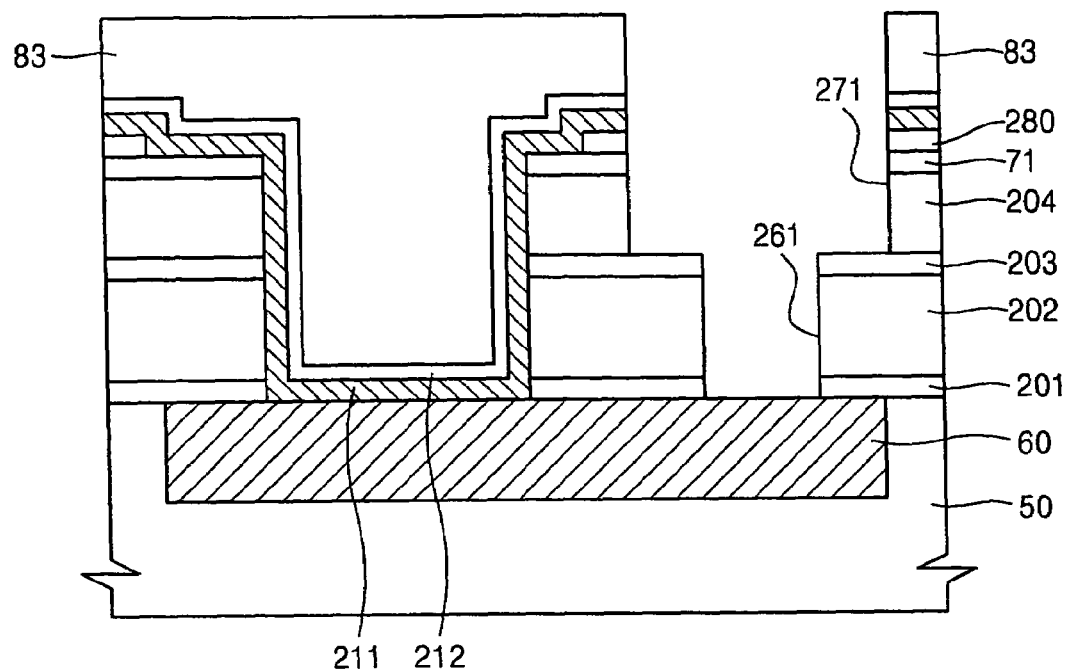
Figure 26:
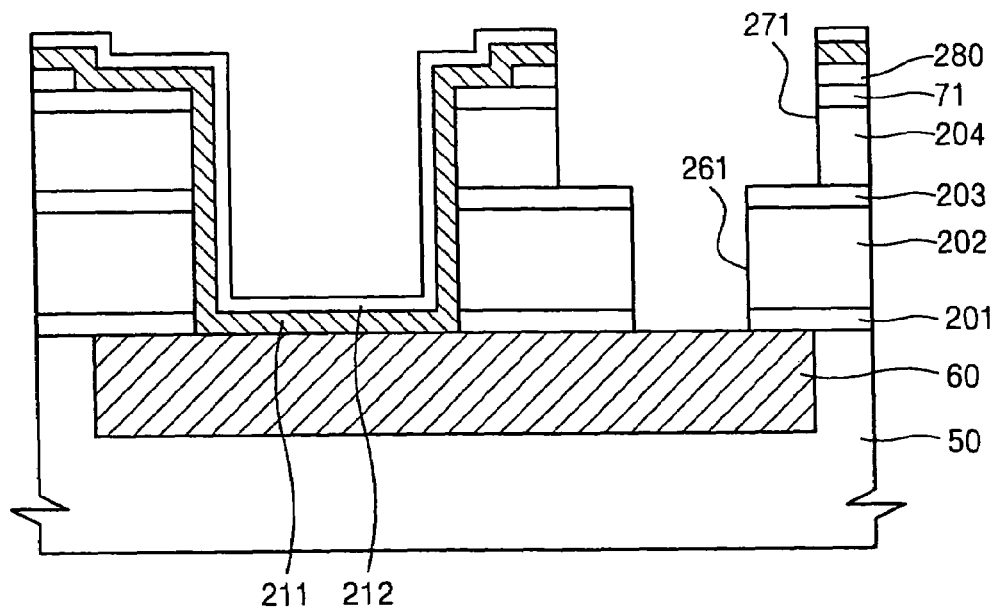

Referring to example FIGS. 23 and 24, a trench 271 (for forming a metal interconnecting layer) is formed by a photo etching process using a photo-resist layer 83 as an etch mask. Some of the SOG material 280 may be left on the bottom of the trench. Referring to example FIG. 25, the lower metal interconnecting layer 60 is exposed by etching back the SOG remaining in the via 261 and the etch stopper 201. Referring to example FIG. 26, the photo-resist layer 83 is removed under conditions that prevents oxidation of the lower metal interconnecting layer 60.

Figure 27:
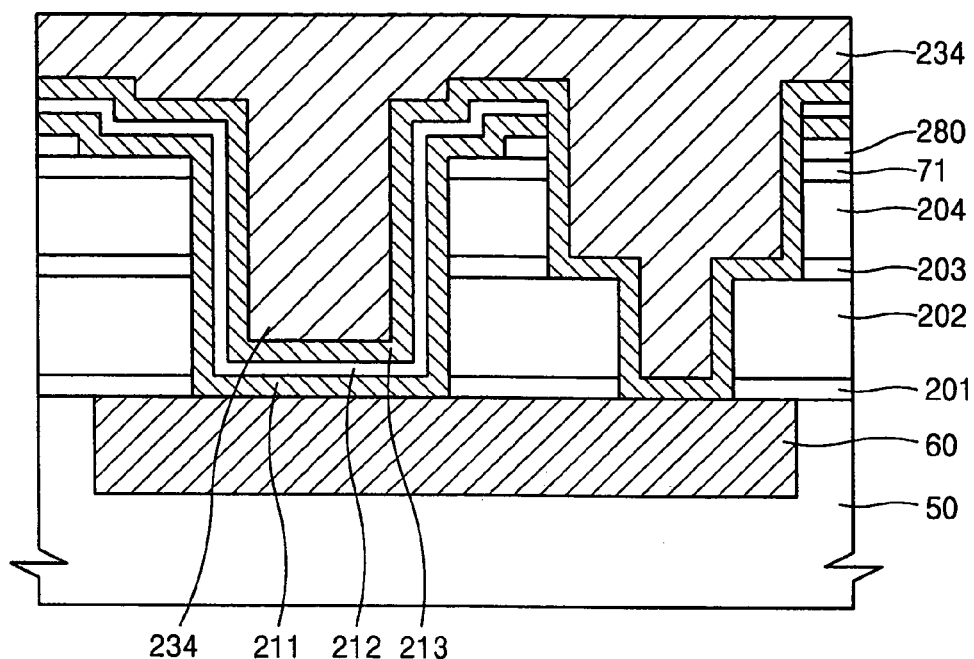

Referring to example FIG. 27, a metal barrier layer 213 is deposited on the entire surface of the resultant structure. A conductive film 234 is formed on the metal barrier layer 213, completely filling the trench 251, the trench 271, and the via 261. The metal barrier 213 may be formed of the same material as the lower metal barrier layer 211. The conductive film 234 may be copper, but may also be an Al film, an Au film, an Ag film, a Ti film, a Ta film, a W film or of materials including an alloy of these films.

Figure 28:
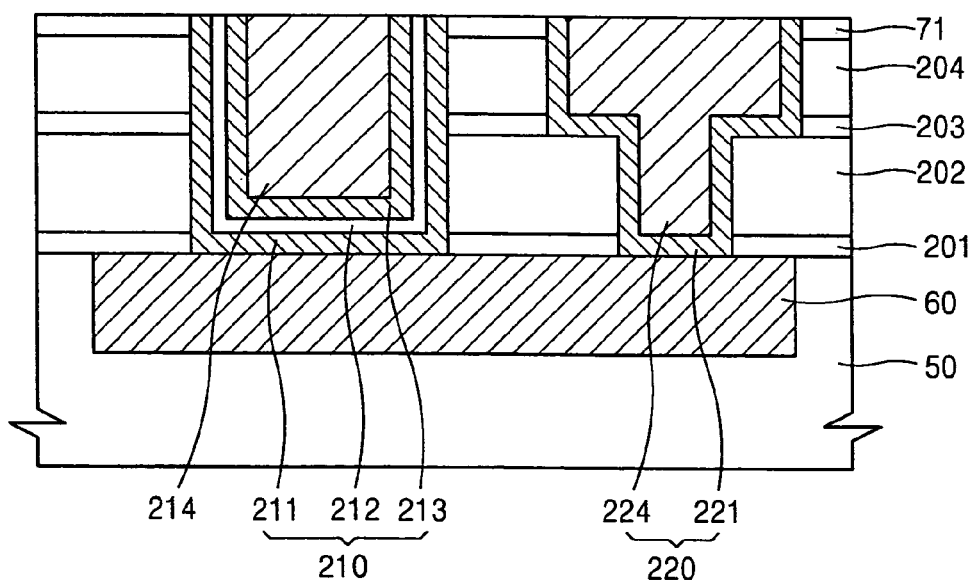

Referring to example FIG. 28, the buffer insulating film 71 (except for the trench portions 251 and 271) is exposed by planarizing the deposited conductive film 234, the metal barrier layers 211 and 213, and the capacitor dielectric film 212 using a CMP process. Accordingly, the MIM capacitor including the upper electrode 213, the capacitor dielectric film 212, and the lower electrode 211 are formed in the trench 251. The interconnecting structure including the conductive film 224 and the metal barrier layer 221 is formed in the via 261 and the trench 271. The MIM capacitor 210 and the interconnecting structure 220 may have substantially equal depths after planarizing.

Figure 29:
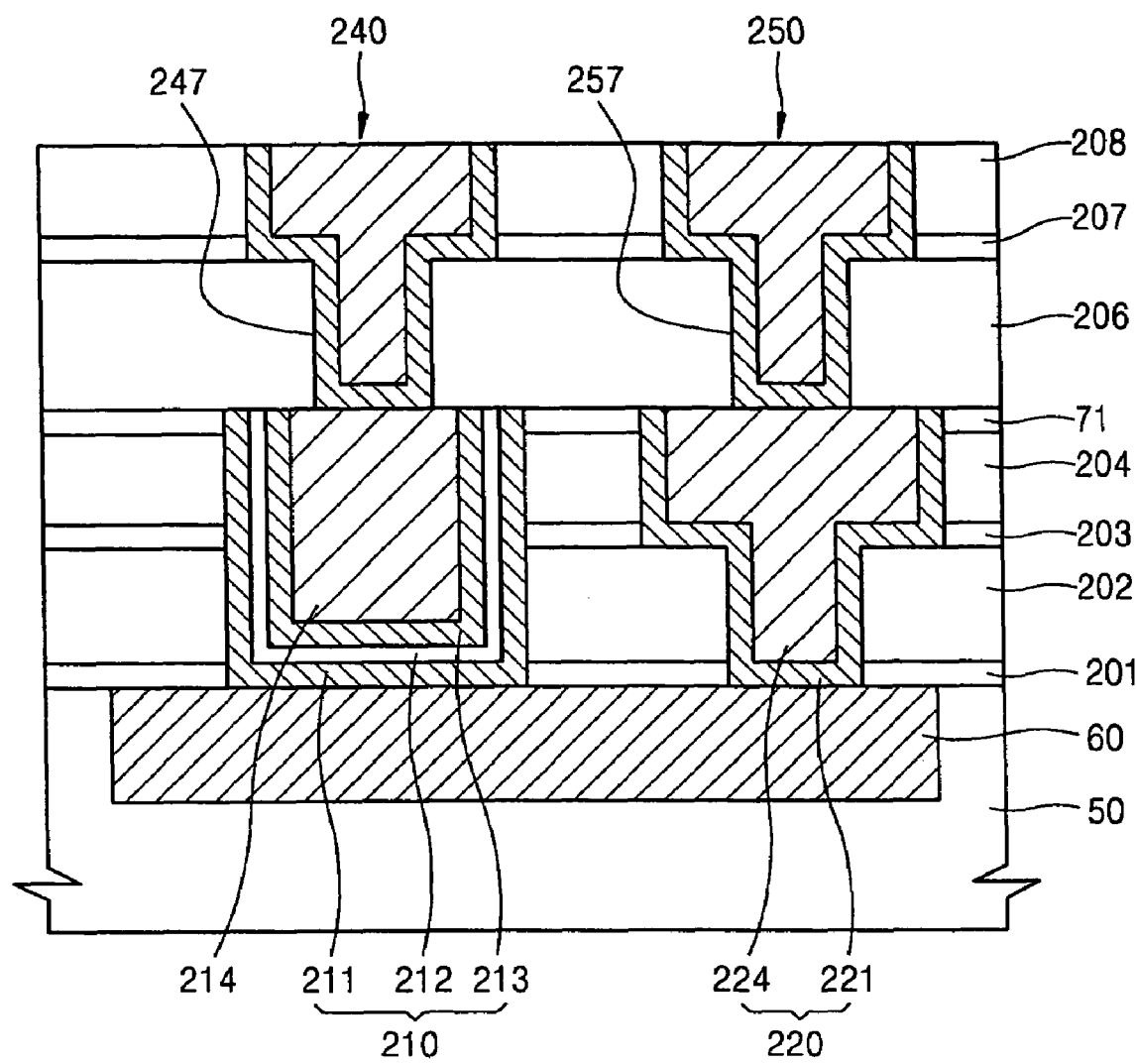

Referring to example FIG. 29, after forming inter-metal insulating films 206 and 208 and an etch stopper 207 on the structure illustrated in example FIG. 28, vias 247 and 257 are formed (e.g. using a dual damascene process). Since the MIM capacitor 210 and the interconnecting structure 220 have substantially equal depths, a via 247 (connecting the MIM capacitor 210 to an upper interconnecting structure 240) and a via 257 (connecting the interconnecting structure 220 to an upper interconnecting structure 250) can be formed at substantially equal depths. Accordingly, in embodiments, when forming the via 257, damage to the upper electrode 213 of the MIM capacitor or the conductive film 214 on the upper electrode 213 by the via 247 may be prevented. The upper interconnecting structures 240 and 250 can be formed by filling the vias 247 and 257 with the metal barrier layer and the conductive film.

In embodiments of the present invention, the via 247 (connecting the MIM capacitor 210 to an upper interconnecting structure 240) and the via 257 (connecting the interconnecting structure 220 to an upper interconnecting structure 250) can be formed at substantially equal depths, because the MIM capacitor 210 and the interconnecting structure 220 are formed at substantially equal depths. Accordingly, in embodiments, the upper interconnecting structures 240 and 250 having substantially the same depth can be formed without damaging the upper electrode 213 of the MIM capacitor 210 or the first conductive film 214 on the upper electrode 213. Further, in embodiments, when forming the conductive films 214 and 224, a photo-resist mask is not necessary. Accordingly, in embodiments, a photo-resist mask is not damaged by a sulfuric acid solution during electroplating of the conductive films 214 and 224.

Embodiments of the present invention relate to the manufacturing of an MIM capacitor in a semiconductor device. As explained with reference to example FIGS. 3 and 4, a plurality of MIM capacitors may be formed (in embodiments) with a mesh pattern. Also, when forming the interconnecting structure 120 to substantially the same depth as the MIM capacitor 110 by using a dual damascene process, the trench 171 (for forming the metal interconnecting) was formed after forming the via 161 (for forming metal interconnecting). However, the via 161 can be formed after the forming of the trench 171.

According to embodiments of the present invention, a via (connecting an upper metal interconnecting structure and an MIM capacitor) and a via (connecting a interconnecting structure and an upper metal interconnecting structure) can be formed at substantially equal depths, because the MIM capacitor can be easily formed to substantially the same depth as the interconnecting structure. Therefore, damage to an upper electrode or a conductive film on the upper electrode (when forming an upper interconnecting structure) may be prevented. Also, a MIM capacitor and a interconnecting structure may be reliable, because a photo-resist mask is not employed for forming a conductive film. Further, the MIM capacitor (manufactured according to embodiments of the present invention) has a high capacitance, since it has a crown shape electrode structure in the trench.

While this invention has been particularly shown and described with reference to example embodiments thereof, it will be understood by those skilled in the art that various changes in form and details may be made therein without departing from the spirit and scope of the invention as defined by the appended claims.

What is claimed is:
1. A method of manufacturing a metal-insulator-metal capacitor device, comprising:
   forming an at least one lower insulating layer on a lower metal interconnecting layer;
   forming a first trench in the at least one lower insulating layer, exposing the lower metal interconnecting layer;
   sequentially depositing a lower barrier metal layer, a capacitor dielectric film, and the upper barrier metal layer in the first trench and over the at least one lower insulating layer;
   forming a first conductive film on the upper barrier layer;
   planarizing the first conductive film to the at least one lower insulating layer;

forming a first via and a second trench in the at least one lower insulating layer, thereby exposing the lower metal interconnecting layer;

forming a second conductive film, filling the first via and the second trench; and planarizing the second conductive film to the at least one lower insulating layer;

wherein said method further comprises, after planarizing the second conductive film;

forming an at least one upper insulating layer on the at least one lower insulating layer;

forming a second via in the at least one upper insulating layer, exposing the first conductive film; and forming a third via in the at least one insulating layer, exposing the second conductive film, wherein the second via and the third via have substantially the same depths.

2. The method of claim 1 further comprising, prior to forming the second conductive film, forming a metal barrier layer in the first via and the second trench.

3. The method of claim 1, wherein the forming the at least one lower insulating layer on the lower metal interconnecting layer comprises:

forming a first etch stopper on the lower metal interconnecting layer;

forming a first insulating film on the first etch stopper;

forming a second etch stopper on the first insulating film;

forming a second insulating film on the second etch stopper; and forming a buffer insulating film on the second insulating film.

4. The method of claim 3, wherein:

the etch stopper is formed of a material selected from the group consisting of SiC, SiN, SiCN, and SiCO; and the buffer insulating film is formed of a material selected from the group consisting of Fluorine-doped Silicate Glass and Undoped Silicate Glass.

5. The method of claim 1 further comprising, prior to forming the first via and the second trench, forming an etch stopper on the planarized first conductive film and the at least one insulating layer.

6. The method of claim 1, wherein the first trench is part of a mesh pattern on the layout of a mask.

7. The method of claim 1, wherein the second trench is formed after the first via is formed.

8. The method of claim 1, wherein the first via is formed after the second trench is formed.

9. The method of claim 1, wherein the capacitor dielectric film is formed using one of atomic layer deposition and chemical vapor deposition.

10. The method of claim 1, wherein the capacitor dielectric film is formed of a film selected from a group consisting of a $SiO_2$ film, a $Si_3N_4$ film, a $Ta_2O_5$ film, a $TiO_2$ film, and an $Al_2O_3$ film.

11. The method of claim 1, wherein the lower metal interconnecting layer, the first conductive film, and the second conductive film are formed of copper.

12. The method of claim 1, wherein the lower metal interconnecting layer, the first conductive film, and the second conductive film are formed of a material selected from a group consisting of Al, Au, Ag, Ti, Ta, W and an alloy including at least one of Al, Au, Ag, Ti, Ta, and W.

13. The method of claim 1, wherein the lower barrier metal layer and the upper barrier metal layer are formed of a layer selected from a group consisting of a Ta layer, a TaN layer, a WN layer, and a layer with a Ta layer/TaN layer structure.

14. A method of manufacturing a metal-insulator-metal capacitor, comprising:

forming at least one lower insulating layer on a lower metal interconnecting layer;

forming a first trench and a first via in the at least one lower insulating layer, exposing the lower metal interconnecting layer, wherein the first via and the first trench have substantially the same depth;

filling the first trench and the first via with an insulating material;

selectively removing the insulating material from the first trench;

forming a lower metal barrier layer and a capacitor dielectric film in the first trench and over the at least one lower insulating layer;

forming a second trench in the at least one lower insulating layer overlapping to the first via;

removing the insulating material in the first via;

forming an upper metal barrier layer over the at least one lower insulating layer on the capacitor dielectric film, in the first via, and the second trench;

forming a conductive film on the upper metal barrier layer, filling the first via, the second trench for metal interconnecting, and the first trench; and planarizing the conductive film to the at least one lower insulating layer.

15. The method of claim 14 further comprising, after planarizing the conductive film:

forming at least one upper insulating layer on the at least one lower insulating layer;

forming a second via in the at least one upper insulating layer, over the first trench, exposing the conductive film; and forming a third via in the at least one upper insulating layer, over the second trench, exposing the conductive film, wherein the second via and the third via have substantially equal depths.

16. The method of claim 14, wherein the action for forming the lower insulating layer comprises:

forming a first etch stopper on the lower metal interconnecting layer;

forming a first insulating film on the first etch stopper;

forming a second etch stopper on the first insulating film;

forming a second insulating film on the second etch stopper; and forming a buffer insulating film on the second insulating film.

17. The method of claim 16, wherein:

the etch stopper is formed of a material selected from the group consisting of SiC, SiN, SiCN, and SiCO; and the buffer insulating film is formed of a material selected from the group consisting of Flourine-doped Silicate Glass and Undoped Silicate Glass.

18. The method of claim 14, wherein the first trench is part of a mesh pattern on the layout of a mask.

19. The method of claim 14, wherein the insulating material that fills the first trench and the first via is Spin-On-Glass.

20. The method of claim 14, wherein the capacitor dielectric film is formed in the first trench using one of atomic layer deposition and chemical vapor deposition.

21. The method of claim 14, wherein the capacitor dielectric film is formed of a film selected from a group consisting of an $SiO_2$ film, an $Si_3N_4$ film, a $Ta_2O_5$ film, a $TiO_2$ film, and an $Al_2O_3$ film.

22. The method of claim 14, wherein the lower metal interconnecting layer and the conductive film are copper.

23. The method of claim 14, wherein the lower metal interconnecting layer and the conductive film are formed of a material selected from a group consisting of Al, Au, Ag, Ti, Ta, W and an alloy including at least one of Al, Au, Ag, Ti, Ta, and W.

24. The method of claim 14, wherein the lower barrier metal layer and the upper barrier metal layer are formed of a layer selected from a group consisting of a Ta layer, a TaN layer, a WN layer, and a layer with a Ta layer/TaN layer structure.

* * * * *